(12) United States Patent
Song et al.

(10) Patent No.: US 10,777,627 B2
(45) Date of Patent: Sep. 15, 2020

(54) ORGANIC LIGHT EMITTING DISPLAY SUBSTRATE AND METHOD FOR MANUFACTURING THE SAME

(71) Applicant: BOE TECHNOLOGY GROUP CO., LTD., Beijing (CN)

(72) Inventors: Zhen Song, Beijing (CN); Guoying Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/453,058

(22) Filed: Jun. 26, 2019

(65) Prior Publication Data

US 2020/0058717 A1    Feb. 20, 2020

(30) Foreign Application Priority Data

Aug. 17, 2018   (CN) .......................... 2018 1 0943179

(51) Int. Cl.
   *H01L 27/32* (2006.01)
(52) U.S. Cl.
   CPC ...... *H01L 27/3246* (2013.01); *H01L 27/3248* (2013.01); *H01L 2227/323* (2013.01)

(58) Field of Classification Search
   CPC ............ G02B 6/0036; G02F 1/133553; H01L 27/3246; H01L 51/5271; H01L 51/5218
   See application file for complete search history.

(56) References Cited

U.S. PATENT DOCUMENTS

| | | | |
|---|---|---|---|
| 2015/0253487 A1* | 9/2015 | Nichol | G02B 6/006 362/610 |
| 2017/0031082 A1* | 2/2017 | Song | G02B 6/0016 |
| 2018/0095559 A1* | 4/2018 | Yamazaki | G06F 3/0416 |

* cited by examiner

*Primary Examiner* — Thomas L Dickey
(74) *Attorney, Agent, or Firm* — Nath, Goldberg & Meyer; Joshua B. Goldberg

(57) ABSTRACT

The present disclosure provides an organic light emitting display substrate and a method for manufacturing the same. The organic light emitting display substrate includes a substrate, and a drive transistor and an organic light emitting diode disposed on the substrate. In a direction away from the substrate, the organic light emitting diode successively includes: a first reflective electrode, an organic light emitting layer, and a second reflective electrode. A drain of the drive transistor is electrically coupled to the first reflective electrode. The organic light emitting display substrate further includes a light guide layer. One side surface of the light guide layer is the light incident surface. The light incident surface is disposed opposite to the light outgoing surface of the organic light emitting diode so that the light emitted from the light outgoing surface enters the light guide layer.

20 Claims, 5 Drawing Sheets

ORGANIC LIGHT EMITTING DISPLAY SUBSTRATE AND METHOD FOR MANUFACTURING THE SAME

CROSS-REFERENCE TO RELATED APPLICATIONS

The present application claims the priority from the Chinese patent application No. 201810943179.2 filed on Aug. 17, 2018, the disclosure of which is incorporated herein by reference in its entirety.

TECHNICAL FIELD

The present disclosure relates to the technical field of display technology, and particularly relates to an organic light emitting display substrate and a method for manufacturing the same.

BACKGROUND

An organic light emitting display device formed by active-matrix organic light emitting diodes (AMOLEDs) has excellent characteristics in power consumption and image, and thus is applied more and more widely.

SUMMARY

The present disclosure provides an organic light emitting display substrate including a substrate, and a drive transistor and an organic light emitting diode disposed on the substrate, where in a direction away from the substrate, the organic light emitting diode successively includes: a first reflective electrode, an organic light emitting layer, and a second reflective electrode, where the organic light emitting layer includes a light outgoing surface through which light is emitted outside from the organic light emitting layer and a non-light outgoing surface through which no light is emitted outside from the organic light emitting layer, and a drain of the drive transistor is electrically coupled to the first reflective electrode;

the organic light emitting display substrate further includes: a light guide layer including a light incident surface through which light is incident into the light guide layer, where the light incident surface is disposed opposite to the light outgoing surface of the organic light emitting diode so that the light emitted from the light outgoing surface enters the light guide layer which is configured to cause the light entering from the light incident surface to be emitted from a surface of the light guide layer proximal to the substrate; and the drive transistor is disposed at a side of the light guide layer distal to the substrate.

In an embodiment, one side surface of the organic light emitting layer is the light outgoing surface, while the rest side surface is the non-light outgoing surface; and one side surface of the light guide layer is the light incident surface.

In an embodiment, the organic light emitting display substrate further includes a first insulating layer disposed between the light outgoing surface and the light incident surface, and the light incident surface and the light outgoing surface are disposed opposite to each other by the first insulating layer.

In an embodiment, the first insulating layer is made of a transparent material.

In an embodiment, the transparent material includes an inorganic insulating material selected from the group consisting of SiOx, SiNx, and AlOx.

In an embodiment, the organic light emitting display substrate further includes: a first light-reflecting layer disposed between the light guide layer and the drive transistor, and covering a surface of the light guide layer distal to the substrate.

In an embodiment, the organic light emitting display substrate further includes: a transparent conductive layer disposed between the first light-reflecting layer and the light guide layer, where at least a part of the transparent conductive layer is superposed with the first light-reflecting layer, and the transparent conductive layer extends between the light outgoing surface and the light incident surface to be coupled to the first reflective electrode of the organic light emitting diode; and a drain of the drive transistor is coupled to the first light-reflecting layer made of a conductive material.

In an embodiment, the transparent conductive layer extends between the organic light emitting layer and the first reflective electrode.

In an embodiment, the organic light emitting display substrate further includes: an electrode layer disposed in a same layer as a gate of the drive transistor, and coupled to the gate; where the electrode layer is disposed opposite to at least a part of the first light-reflecting layer to form a first capacitor.

In an embodiment, the organic light emitting display substrate further includes: a metal layer disposed in a same layer as the drain of the drive transistor at a side of the electrode layer distal to the substrate, and coupled to the drain; where at least a part of the metal layer is disposed opposite the electrode layer to form a second capacitor.

In an embodiment, the organic light emitting display substrate further includes: a second light-reflecting layer disposed outside the non-light outgoing surface of the organic light emitting layer, and configured to reflect light emitted from the non-light outgoing surface back to the organic light emitting layer.

In an embodiment, the light guide layer includes: a reflective structure disposed on each surface of the light guide layer except the light incident surface and the surface proximal to the substrate, and configured to reflect light emitted from inside of the light guide layer toward the surface back into the light guide layer.

In an embodiment, at least a part of the second reflective electrode is disposed at a side of the drive transistor distal to the substrate and covers the drive transistor.

In an embodiment, the organic light emitting display substrate further includes: a planarization layer disposed at the side of the light guide layer distal to the substrate, and in contact with the light guide layer, the planarization layer having a refractive index smaller than that of the light guide layer.

In an embodiment, the organic light emitting display substrate further includes: a color filter layer disposed at a side of the light guide layer proximal to the substrate; and a transparent insulating layer disposed between the color filter layer and the light guide layer, the transparent insulating layer having a refractive index greater than that of the light guide layer.

The present disclosure further provides a method for manufacturing an organic light emitting display substrate, including:

disposing a drive transistor and an organic light emitting diode on a substrate so that in a direction away from the substrate, the organic light emitting diode successively includes: a first reflective electrode, an organic light emitting layer, and a second reflective electrode, where the organic light emitting layer includes a light outgoing surface through which light is emitted outside from the organic light emitting layer and a non-light outgoing surface through which no light is emitted outside from the organic light emitting layer, and a drain of the drive transistor is electrically coupled to the first reflective electrode;

where the disposing the drive transistor and the organic light emitting diode on the substrate further includes disposing a light guide layer on the substrate so that the light guide layer includes a light incident surface through which light is incident into the light guide layer, the light incident surface is disposed opposite the light outgoing surface of the organic light emitting diode, the light emitted from the light outgoing surface enters the light guide layer which is configured to cause the light entering from the light incident surface to be emitted from a surface of the light guide layer proximal to the substrate, and the drive transistor is disposed at a side of the light guide layer distal to the substrate.

In an embodiment, the disposing the drive transistor and the organic light emitting diode on the substrate includes:

forming a color filter layer on a portion of the substrate and forming a transparent insulating layer on the color filter layer and a portion of the substrate so that the transparent insulating layer covers the color filter layer, and forming the first reflective electrode on the transparent insulating layer so that only a part of the first reflective electrode overlaps an edge portion of the color filter layer:

forming the light guide layer on an upper surface of the transparent insulating layer at a position corresponding to the color filter layer so that a reflective structure is formed on a part of the light guide layer except a bottom surface and a side surface proximal to the first reflective electrode:

forming a planarization layer having an opening on an upper surface of the light guide layer, and an exposed upper surface of the transparent insulating layer so that a portion of the first reflective electrode and a portion of the upper surface and the side surface of the light guide layer proximal to the first reflective electrode are exposed, and so that an edge of the first reflective electrode distal to the light guide layer is spaced apart from the planarization layer to expose a portion of the upper surface of the transparent insulating layer proximal to the edge;

forming a transparent conductive layer on an upper surface of the planarization layer, the exposed portion of the upper surface and the exposed side surface of the light guide layer, and the exposed portion of the upper surface of the first reflective electrode;

forming a light-reflecting material layer having an opening on an upper surface of the transparent conductive layer, the remaining surface of the planarization layer, and the exposed portion of the upper surface of the transparent insulating layer, so as to expose a part of the transparent conductive layer corresponding to the light incident surface of the light guide layer and the upper surface of the transparent conductive layer superposed with the first reflective electrode, thereby forming a first light-reflecting layer on the transparent conductive layer covering the light guide layer and a second light-reflecting layer in contact with an edge of the transparent conductive layer distal to the light guide layer and the exposed portion of the upper surface of the first reflective electrode;

forming a first insulating layer covering a formed structure;

forming an active layer and a second insulating layer separated from each other on a portion of the upper surface of the first insulating layer covering the first light-reflecting layer, and forming a gate dielectric layer on the active layer;

forming a gate on the gate dielectric layer and forming an electrode layer on the second insulating layer;

forming an interlayer dielectric layer having a first via hole and a second via hole to cover a formed structure so that the first via hole exposes only a portion of the active layer, and the second via hole exposes an edge of the active layer and a portion of the first light-reflecting layer:

forming a source, a drain, and a metal layer in the first via hole, in the second via hole, and on the interlayer dielectric layer, respectively so that the metal layer is disposed opposite to the electrode layer and electrically coupled to the drain;

forming a third insulating layer and a pixel defining layer successively covering the formed structure:

forming a third via hole penetrating the first insulating layer, the interlayer dielectric layer, the third insulating layer and the pixel defining layer to expose a portion of the transparent conductive layer:

forming the organic light emitting layer and the second reflective electrode on the pixel defining layer and in the third via hole.

DETAILED DESCRIPTION

To improve understanding of the technical solution of the present disclosure for those skilled in the art, the present disclosure will now be described in detail with the help of accompanying drawings and specific embodiments.

In the present disclosure, two structures "disposed in the same layer" means that the two structures are formed by the same material layer, so they are in the same layer in the layered relationship, which does not mean that they have the same distance relative to the substrate, or that other layer structures between them and the substrate are identical.

In the present disclosure, a "patterning process" refers to a step of forming a structure having a specific pattern, which may be a photolithography process including one or more of forming a material layer, coating photoresist, exposing, developing, etching, and peeling off photoresist; obviously, the "patterning process" may also be any other process such as an imprint process, an inkjet printing process, and the like.

Figure 1:
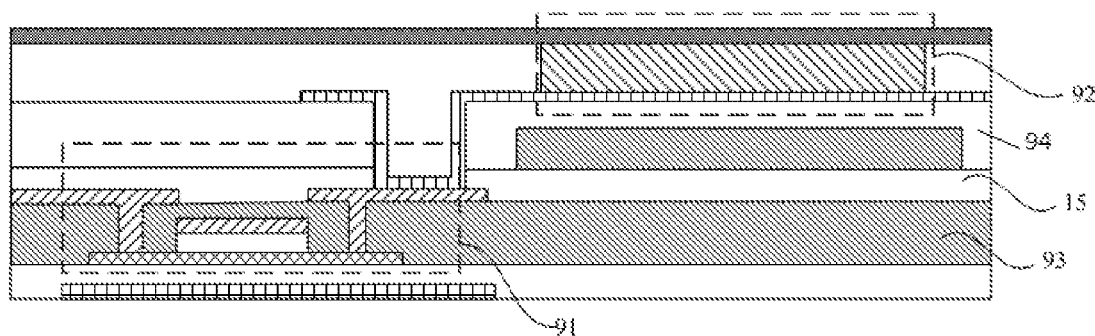
FIG. 1 is a cross-sectional diagram of a structure of an organic light emitting display substrate disclosed in the related art.

An organic light emitting display substrate in the related art is shown in FIG. 1. The organic light emitting display is a bottom-emission type organic light emitting display substrate, including a thin film transistor 91 and an organic light emitting diode 92, where at least a dielectric layer 94 and a planarization layer 15 are disposed between the thin film transistor 91 and the organic light emitting diode 92, and a first electrode (such as an anode) of the organic light emitting diode 92 is coupled to a drain of the thin film transistor 91 via a through hole in the dielectric layer 94 and the planarization layer 15. Since light emitted by the organic light emitting diode can only exit through a transparent structure, a light outgoing surface cannot be formed at a position of the thin film transistor 91, thus limiting a ratio of an area of the light outgoing surface to the entire area of the organic light emitting display substrate, resulting in a lower luminance of the light emitting display device formed by the organic light emitting display substrate.

In addition, the light emitted by the organic light emitting diode needs to pass through a plurality of same layers as for the thin film transistor 91, which increases light loss and results in a reduced luminance of the light emitting display device.

Figure 2A:
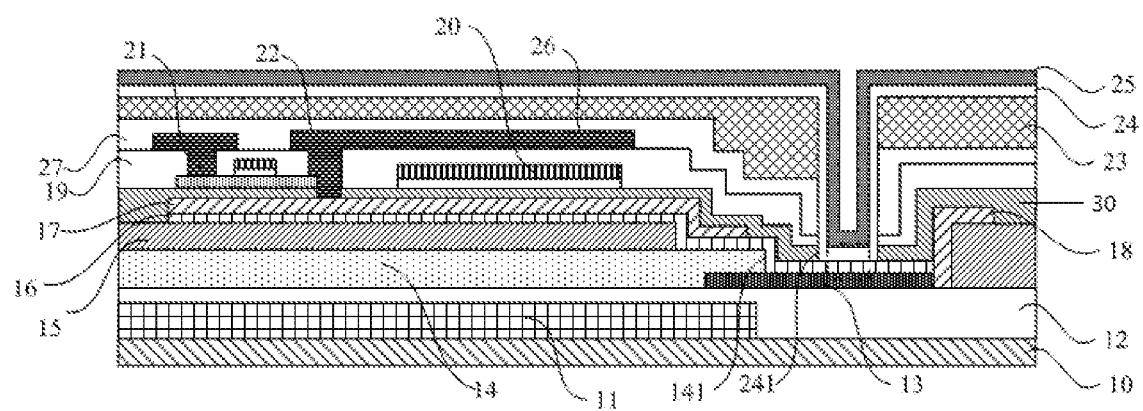
FIG. 2a is a cross-sectional diagram of a structure of an organic light emitting display substrate according to an embodiment of the present disclosure.
Figure 2B:
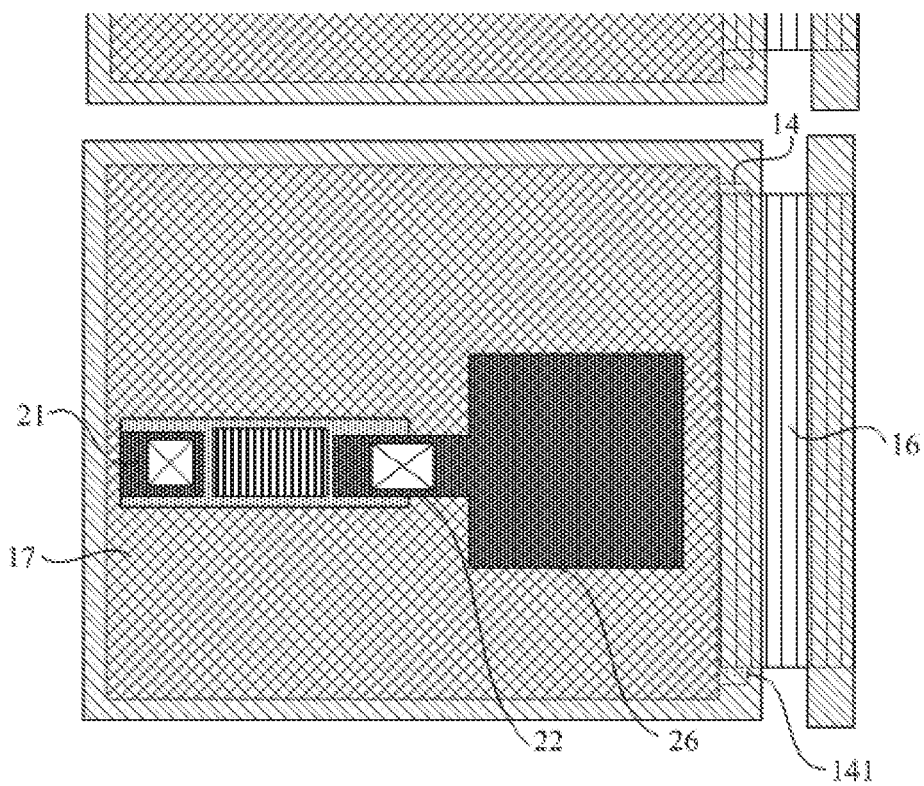
FIG. 2b is a planar diagram of a structure of an organic light emitting display substrate according to an embodiment of the present disclosure.

In an embodiment according to the present disclosure, as shown in FIGS. 2a and 2b (FIG. 2b mainly reflects the relative positional relationship between the light guide layer 14 and the organic light emitting diode for emitting light; to better reflect positions of the above key structures, some other structures are not shown in FIG. 2), an organic light emitting display substrate including a substrate 10, and a drive transistor and an organic light emitting diode disposed on the substrate 10 is provided.

In a direction away from the substrate 10, the organic light emitting diode successively includes: a first reflective electrode 13 (such as a reflective anode), an organic light emitting layer 24, and a second reflective electrode 25 (such as a reflective cathode). One side surface of the organic light emitting layer 24 is a light outgoing surface 241 for emitting light, while the rest side surface is a non-light outgoing surface. A drain 22 of the drive transistor is electrically coupled to the first reflective electrode 13. For example, the organic light emitting layer includes an upper surface facing the first reflective electrode 13, a lower surface facing the second reflective electrode 25, and two side surfaces therebetween. One of the side surfaces is the light outgoing surface, while the other is the non-light outgoing surface. The upper surface, the lower surface and the non-light outgoing surface herein may include a material capable of letting light to exit, but with a light-reflecting layer disposed outside the upper surface, the lower surface, and the non-light outgoing surface so that the light is reflected back into the organic light emitting layer and emitted outside only from the light outgoing surface.

The organic light emitting display substrate further includes a light guide layer 14. One side surface of the light guide layer 14 is a light incident surface 141, and the light incident surface 141 is disposed opposite to the light outgoing surface 241 of the organic light emitting diode so that the light emitted from the light outgoing surface 241, for example, enters the light guide layer 14 through a first insulating layer 30 as shown in FIG. 2. The light guide layer 14 is used for causing the light entering from the light incident surface 141 to be emitted from a surface of the light guide layer 14 proximal to the substrate 10.

The first insulating layer 30 may be made of an inorganic insulating material such as SiOx, SiNx or AlOx, which is a transparent material and does not affect the light emitted from the light outgoing surface 241 and entering the light guide layer 14.

The drive transistor is disposed at a side of the light guide layer 14 distal to the substrate 10.

That is, the organic light emitting diode is disposed at a side of the light guide layer 14, i.e., at a side proximal to the light incident surface 141 of the light guide layer 14; while the drive transistor is disposed at a side of the light guide layer 14 distal to the substrate 10. As a result, light emitted from one side surface (the light outgoing surface 241) of the organic light emitting layer 24 can enter the light guide layer 14 through the light incident surface 141, and be eventually uniformly emitted from a surface of the light guide layer 14 proximal to the substrate 10 (a lower surface of the light guide layer 14).

In the organic light emitting display substrate of the present embodiment, as shown in FIG. 2a, the light emitted from the entire organic light emitting display substrate is finally emitted from the lower surface of the light guide layer 14 (thereby the organic light emitting display substrate is in the form of a bottom-emission type, i.e., light is emitted outside through the substrate 10), while the drive transistor is disposed at the side of the light guide layer 14 distal to the substrate 10, so the position of the drive transistor will not affect light emission. That is, the light guide layer 14 can transmit light to a position corresponding to the drive transistor, and the drive transistor does not limit a ratio of a light emitting area to an area of the entire organic light emitting display substrate. The light emitting area in the organic light emitting display substrate is determined by the lower surface of the light guide layer 14 so that the ratio of the light emitting area to the area of the entire organic light emitting display substrate is increased, thereby increasing the luminance of a light emitting display device including the organic light emitting display substrate.

It can be seen that since the first reflective electrode 13 and the second reflective electrode 25 not only have electrical conductivity but also are capable of reflecting light, light emitted from the organic light emitting layer 24 can only be emitted outside from a side surface (the light outgoing surface 241) of the organic light emitting layer 24 rather than the upper surface or the lower surface. Therefore, as shown in FIG. 2b, the organic light emitting diode actually emits light from the side surface of the organic light emitting layer 24, and thus may be equivalent to a line light source (i.e. a stripped portion at the right side of FIG. 2b). In this way, a volume of the organic light emitting diode and thus a volume of the entire organic light emitting display substrate are reduced. The light emitted from the line light source enters the light guide layer 14, and is then emitted outside from a lower side of the light guide layer 14. That is, a light emitting area of the organic light emitting display substrate (an actual area where light is emitted from the organic light emitting display substrate; the sliced portion at the left side of FIG. 2b) is greater than an area of the organic light emitting diode that actually emits light. Thus, the actual luminance is not reduced with the line light source.

The light emitted from the organic light emitting layer 24 may generate resonance (i.e. form a microcavity, as shown by the dotted portion in FIG. 2b) when being reflected between two electrodes of the organic light emitting diode, thereby increasing an intensity of the light. However, in an existing organic light emitting diode, light is emitted from one of the electrodes, so the electrode should have a higher transmittance, which results in a reduced capability of light reflection and a reduced resonance effect. In the organic light emitting display substrate in the present disclosure, the organic light emitting layer 24 emits light at a side surface, so that the first reflective electrode 13 and the second reflective electrode 25 may have increased reflection capabilities, and light can be continuously reflected between the first reflective electrode 13 and the second reflective electrode 25. Therefore, the organic light emitting diode herein is a light emitting device having a strong microcavity structure.

Meanwhile, since the light guide layer 14 is disposed on the upper surface of the substrate 10 and may be in direct contact with the substrate 10, the light emitted from the lower surface of the light guide layer 14 may not pass through a plurality of layers, thereby reducing light loss and thus increasing the brightness of the light emitting display device.

In the embodiment as described above, a portion of the organic light emitting layer 24 interposed between the first reflective electrode 13 and the second reflective electrode 25 emits light, and the generated light will propagate upward, downward and sideward. In order to cause the generated light to be emitted outside only from the light outgoing surface 241, a first reflective electrode 13 and a second reflective electrode 25 having reflection capabilities are provided, and a second light-reflecting layer 18 is provided outside the side surface as the non-light outgoing surface so that the light propagating in the three directions is reflected back into the organic light emitting layer and can only be emitted outside from the light outgoing surface 241.

FIG. 2*a* merely shows an example, but the present application is not limited thereto, as long as the light generated from the organic light emitting layer is restricted to be emitted outside only from one light outgoing surface, and the emitted light is introduced through the light incident surface of the light guide layer. Therefore, in the present application, the light outgoing surface may be one side surface of the organic light emitting layer, or may be a portion of one side surface of the organic light emitting layer, or may include a portion of the upper or lower surface of the organic light emitting layer. In addition, in the present application, the light incident surface of the light guide layer may be a portion of the side surface of the light guide layer, or may include a portion of the upper or lower surface the light guide layer.

In an embodiment, the organic light emitting display substrate further includes a first light-reflecting layer 17 disposed between the light guide layer 14 and the drive transistor, and covering a surface of the light guide layer 14 distal to the substrate 10.

That is, the first light-reflecting layer 17 separates the light guide layer 14 from the drive transistor, and covers a surface of the entire light guide layer 14 distal to the substrate 10 (the upper surface of the light guide layer 14).

The light entering the light guide layer 14 through the light incident surface 141 propagates in the light guide layer 14. When a part of the light is emitted from the upper surface of the light guide layer 14, the first light-reflecting layer 17 on the upper surface of the light guide layer 14 may reflect the light back into the light guide layer 14 so that the light can be emitted outside from the lower surface of the light guide layer 14, thus reducing light loss and increasing luminous brightness.

In an embodiment, the organic light emitting display substrate further includes: a transparent conductive layer 16 disposed between the first light-reflecting layer 17 and the light guide layer 14. At least a part of the transparent conductive layer 16 is superposed with the first light-reflecting layer 17, the transparent conductive layer 16 extends between the light outgoing surface 241 and the light incident surface 141 to be coupled to the first reflective electrode 13 of the organic light emitting diode; and a drain 22 of the drive transistor is coupled to the first light-reflecting layer 17 made of a conductive material.

That is, the transparent conductive layer 16 is located on a lower surface of the first light-reflecting layer 17, and superposed with the first light-reflecting layer 17, while the drive transistor is located on an upper surface of the first light-reflecting layer 17. The transparent conductive layer 16 extends between the light outgoing surface 241 and the light incident surface 141 to be connected with the first reflective electrode 13. That is, the drain 22 of the drive transistor is coupled to the first reflective electrode 13 of the organic light emitting diode through the first light-reflecting layer 17 and the transparent conductive layer 16.

Since the drive transistor is disposed above the light guide layer 14, a connection structure between the drain 22 and the first reflective electrode 13 will inevitably pass through a region between the light incident surface 141 and the light outgoing surface 241. If the connection structure is light-reflective, light cannot be incident into the light guide layer 14 at the position of the connection structure. As a result, the light utilization efficiency is reduced. Therefore, the transparent conductive layer 16 may be used for extending through the region between the light incident surface 141 and the light outgoing surface 241 to conduct electricity.

In an embodiment, the transparent conductive layer 16 extends between the organic light emitting layer 24 and the first reflective electrode 13.

Specifically, the transparent conductive layer 16 is disposed between the organic light emitting layer 24 and the first reflective electrode 13. That is, a portion of the transparent conductive layer 16 is in direct contact with the organic light emitting layer 24. There are some requirements for properties of the electrodes in an organic light emitting diode in contact with the organic light emitting layer 24, where the anode is generally made of a transparent conductive material such as indium tin oxide (ITO), while the reflective electrode is generally made of a metal or the like. Direct contact between the first reflective electrode 13 and the organic light emitting layer 24 may affect the performance of the organic light emitting diode. Therefore, the transparent conductive layer 16 may be disposed between the organic light emitting layer 24 and the first reflective electrode 13 so that the requirements for properties of the first electrode (anode) are satisfied.

Optionally, the organic light emitting display substrate of the embodiment further includes: an electrode layer 20 disposed in the same layer as a gate of the drive transistor, and coupled to the gate. The electrode layer 20 corresponds to (i.e., is disposed opposite to) at least a part of the first light-reflecting layer 17 to form a first capacitor.

Specifically, the electrode layer 20 and the first light-reflecting layer 17 form a first capacitor which may be a storage capacitor.

The electrode layer 20 coupled to the gate may avoid floating of the electrode layer 20, and ensure effectiveness of the storage capacitor formed by the electrode layer 20 and the first light-reflecting layer 17.

Optionally, the organic light emitting display substrate of the embodiment further includes: a metal layer 26 disposed in the same layer as the drain 22 of the drive transistor at a side of the electrode layer 20 distal to the substrate 10, and coupled to the drain 22. At least a part of the metal layer 26 corresponds to the electrode layer 20 to form a second capacitor.

Here, the second capacitor is composed of the electrode layer 20 and the opposite metal layer 26. Therefore, the resultant storage capacitor is a stack of capacitors formed by the electrode layer 20 with the opposite metal layer 26 and with the first light-reflecting layer 17.

The stack of capacitors not only reduces an area occupied by the storage capacitor, but also increases the capacity of the storage capacitor, thereby improving the performance of the organic light emitting display substrate.

Optionally, the organic light emitting display substrate of the embodiment further includes: a second light-reflecting layer 18 disposed outside the non-light outgoing surface of the organic light emitting layer, and configured to reflect light emitted from the non-light outgoing surface back into the organic light emitting layer.

In that, for example, when the organic light emitting layer 24 is a polygonal layered structure (such as a square layered structure or a rectangular layered structure), since the light outgoing surface 241 may be only one of the side surfaces, the light emitted by the organic light emitting layer 24 may be emitted outside from other non-light outgoing surfaces. In this case, the second light-reflecting layer 18 is disposed outside the non-light outgoing surface, and reflects light back into the organic light emitting layer 24 so that the light is only emitted from the light outgoing surface 241 of the organic light emitting layer 24, thus further reducing light loss and increasing the luminous brightness. Specifically, the second light-reflecting layer 18 may be disposed in the same layer as the first light-reflecting layer 17. Obviously, first reflective electrodes 13 in different sub-pixels should be disconnected from each other. Therefore, as shown in FIG. 2b, when coupled to the first reflective electrode 13, the second light-reflecting layer 18 cannot be coupled to a light-reflecting layer of any other sub-pixel.

Optionally, the light guide layer 14 includes: a reflective structure disposed on each surface of the light guide layer 14 except the light incident surface 141 and the surface proximal to the substrate 10, and configured to reflect light emitted from inside of the light guide layer 14 back into the light guide layer 14.

That is, except the light incident surface 141 and the lower surface of the light guide layer 14, each of the remaining surfaces of the light guide layer 14 is provided with a reflective structure. Optionally, the reflective structure on a top surface of the light guide layer 14 may be a convex structure, such as a sphere or a cube, while the reflective structure on a side surface of the light guide layer 14 may be a sawtooth structure.

The reflective structure of the light guide layer 14 may reflect the light entering the light guide layer 14 as much as possible, and reduce light emission from other surfaces than the lower surface of the light guide layer 14, thereby reducing light loss.

Optionally, at least a part of the second reflective electrode 25 is disposed at a side of the drive transistor distal to the substrate 10 and covers the drive transistor.

That is, the second reflective electrode 25 may cover the entire drive transistor and the organic light emitting diode.

In this way, complete light shielding for the drive transistor can be achieved by the second reflective electrode 25 and the first light-reflecting layer 17, thus effectively improving the reliability of the organic light emitting display substrate.

Optionally, the organic light emitting display substrate of the embodiment further includes: a planarization layer 15 disposed at a side of the light guide layer 14 distal to the substrate 10 and in contact with the light guide layer 14. The planarization layer 15 has a refractive index smaller than that of the light guide layer 14.

That is, the planarization layer 15 may be located between the light guide layer 14 and the transparent conductive layer 16.

The planarization layer 15 having a refractive index smaller than that of the light guide layer 14 can ensure that the light in the light guide layer 14 is totally reflected as much as possible by an interface between the light guide layer 14 and the planarization layer 15, thus reducing light loss.

Optionally, the organic light emitting display substrate of the embodiment further includes: a color filter layer 11 disposed at a side of the light guide layer 14 proximal to the substrate 10; and a transparent insulating layer 12 disposed between the color filter layer 11 and the light guide layer 14. The transparent insulating layer 12 has a refractive index greater than that of the light guide layer 14.

The color filter layer 11 has a color corresponding to actual conditions, such as red, yellow, and the like. The transparent insulating layer 12 having a refractive index greater than that of the light guide layer 14 aims to prevent the light in the light guide layer 14 from being totally reflected at an interface between the light guide layer 14 and the transparent insulating layer 12.

Figure 3A:
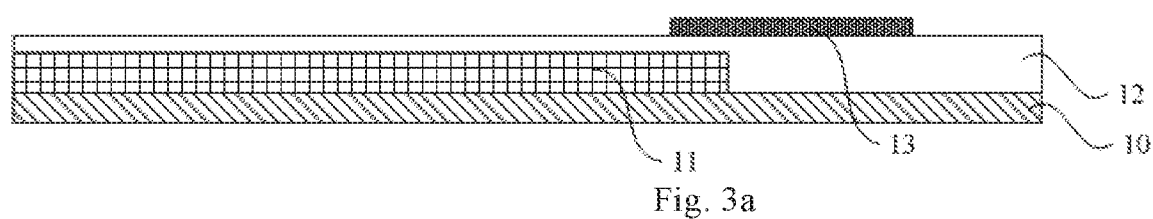
FIGS. 3a to 3g are cross-sectional diagrams corresponding to structures formed at respective steps of a method for manufacturing an organic light emitting display substrate according to an embodiment of the present disclosure.
Figure 3B:
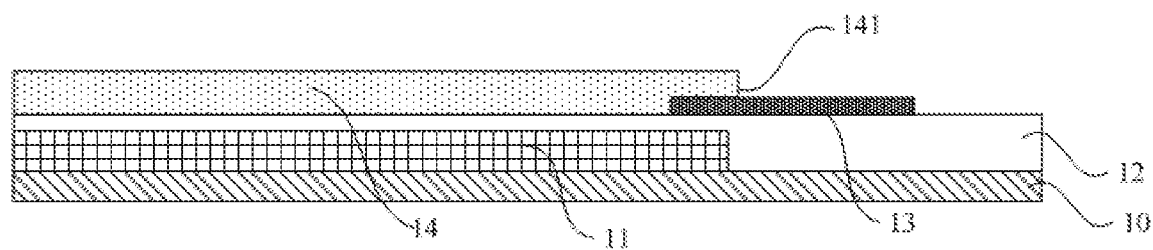
Figure 3C:
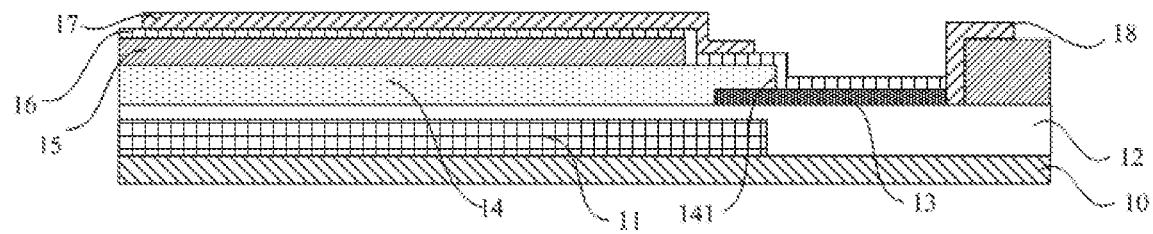
Figure 3D:
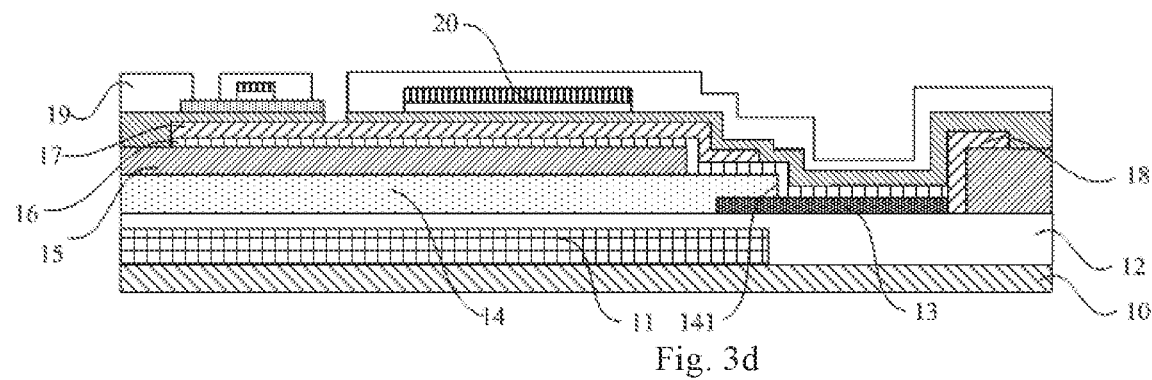
Figure 3E:
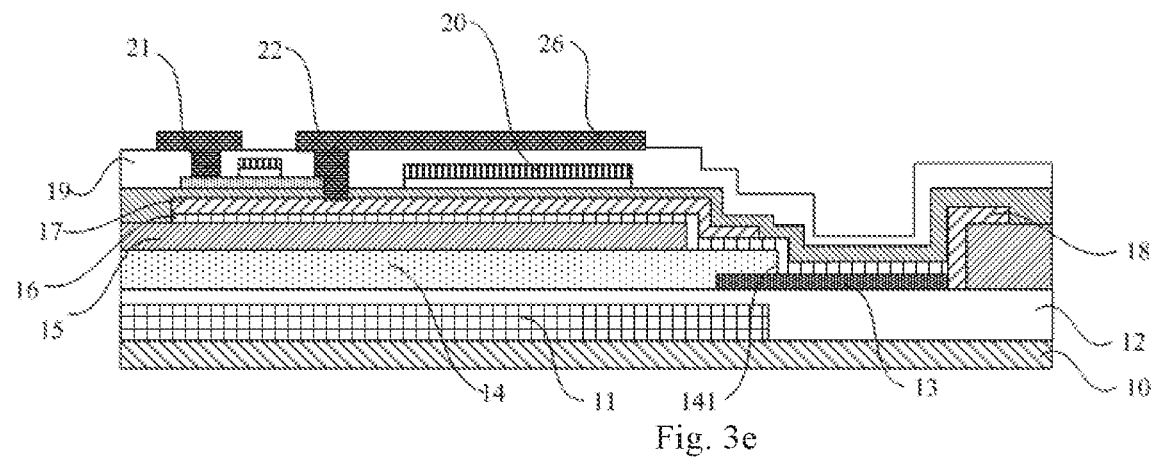
Figure 3F:
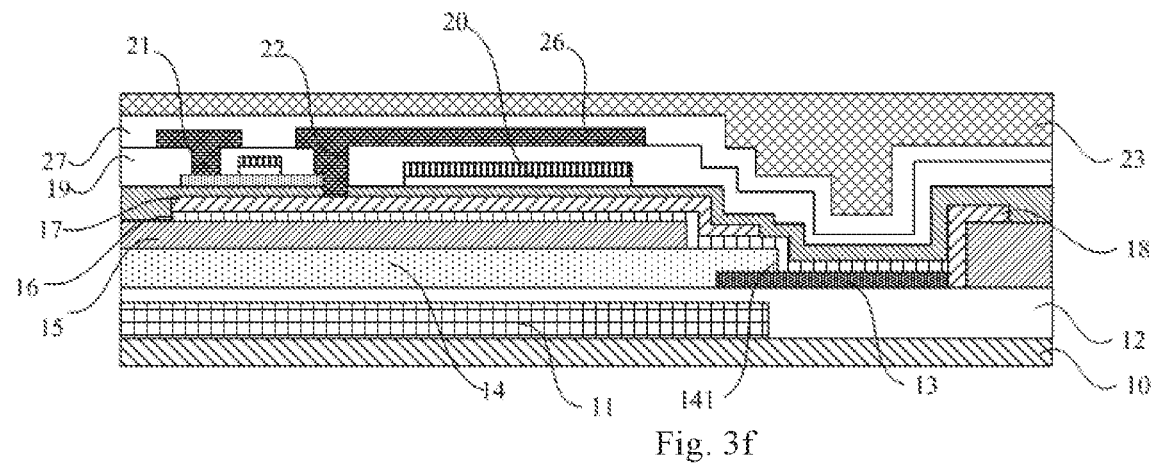
Figure 3G:
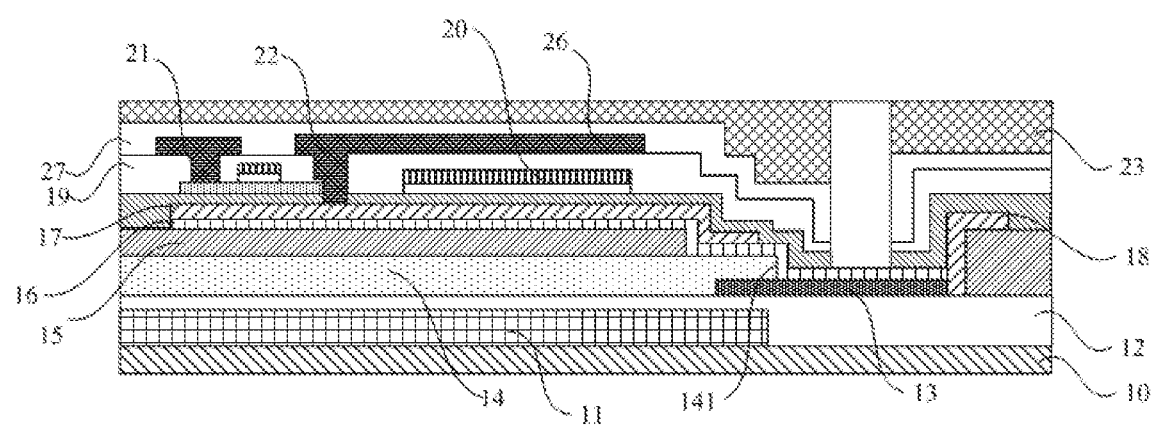
Figure 4:
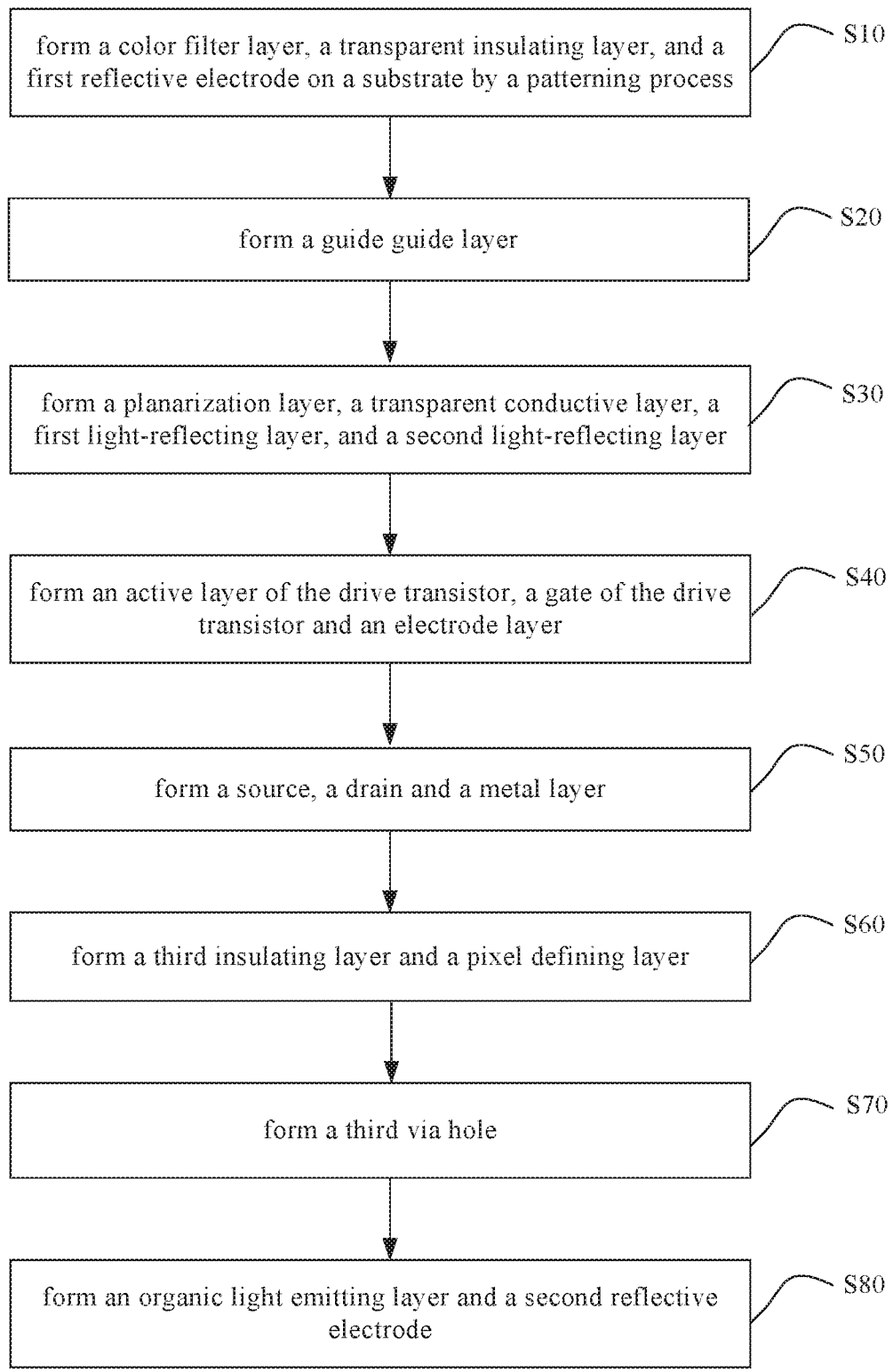
FIG. 4 is a flowchart of the method for manufacturing the organic light emitting display substrate according to an embodiment of the present disclosure.

According to an embodiment of the present application, as shown in FIGS. 2a, 2b, and 3a to 3g, the embodiment provides a method for manufacturing an organic light emitting display substrate as shown in FIG. 4, including the following steps S10 to S80:

At the step S10, as shown in FIG. 3a, a color filter layer 11, a transparent insulating layer 12, and a first reflective electrode 13 is formed on a substrate 10 by a patterning process.

Specifically, at a step S11, the color filter layer 11 is formed on an upper surface of the substrate 10. The color filter layer 11 may have a color corresponding to actual conditions, such as red, yellow, and the like.

At step S12, the transparent insulating layer 12 is formed on the color filter layer 11 and a portion of the upper surface of the substrate 10, and the transparent insulating layer 12 covers the color filter layer 11.

At step S13, the first reflective electrode 13 (such as a reflective anode) is formed on an upper surface of the transparent insulating layer 12, where most of the first reflective electrode 13 does not cover the color filter layer 11, and only a portion proximal to an edge of the first reflective electrode 13 overlaps the color filter Layer 11.

At the step S20, as shown in FIG. 3b, a light guide layer 14 is formed.

Specifically, a light guiding material is coated on a part of the upper surface of the transparent insulating layer 12 corresponding to the color filter layer 11 to form the light guide layer 14. The light guiding material includes, but is not limited to, one or more of acryl diethylene glycol carbonate, polymethyl methacrylate, polycarbonate, polystyrene.

A reflective structure is formed on each surface of the light guide layer 14 except a bottom surface and a side surface (i.e., the light incident surface 141) corresponding to the first reflective electrode 13. The reflective structure on a top surface of the light guide layer 14 may be a convex structure, such as a sphere or a cube, while the reflective structure on a side surface of the light guide layer 14 opposite to the light incident surface 141 may be a sawtooth structure.

At the step S30, as shown in FIG. 3c, a planarization layer 15, a transparent conductive layer 16, a first light-reflecting layer 17, and a second light-reflecting layer 18 are formed.

Specifically, at a step S31, a planarization film is formed on an upper surface of the light guide layer 14, an upper surface of the first reflective electrode 13, and an exposed upper surface of the transparent insulating layer 12. An opening is formed in the planarization film based on a preset pattern so that a portion of the first reflective electrode 13 and a portion of the upper surface and the side surface of the light guide layer 14 proximal to the first reflective electrode 13 are exposed, and an edge of the first reflective electrode 13 distal to the light guide layer 14 is spaced apart from the transparent insulating layer 12 to expose the upper surface of the transparent insulating layer 12 proximal to the edge, thus forming the planarization layer 15. A material of the planarization layer 15 includes, but is not limited to, a material having a planarization effect such as a polysiloxane-based material, an acrylic-based material, or a polyimide-based material.

At a step S32, a transparent conductive layer 16 is formed on an upper surface of the planarization layer 15, the exposed portion of upper surface and side surface of the light guide layer 14, and the exposed upper surface of the first reflective electrode 13.

At a step S33, a light-reflecting material layer is formed on the upper surface of the transparent conductive layer 16, the remaining upper surface of the planarization layer 15 and the exposed transparent insulating layer 12. An opening is formed in the light-reflecting material layer based on a preset pattern by a patterning process so as to expose the transparent conductive layer 16 corresponding to the light incident surface 141 of the light guide layer 14 and the upper surface of the transparent conductive layer 16 superposed with the first reflective electrode 13, thus forming the first light-reflecting layer 17 and the second light-reflecting layer 18. That is, the opening divides the light-reflecting material layer into two parts, where one is the first light-reflecting layer 17 covering the light guide layer 14, and the other is the second light-reflecting layer 18 in contact with an edge of the transparent conductive layer 16 distal to the light guide layer 14 and an edge of the first reflective electrode 13 distal to the light guide layer 14.

At the step S40, as shown in FIG. 3d, an active layer of the drive transistor, a gate of the drive transistor and an electrode layer 20 are formed.

Specifically, at a step S41, a first insulating layer 30 is formed, where the first insulating layer completely covers an upper surface of the formed layer structure.

At a step S42, the active layer and a second insulating layer are formed on an upper surface of the first insulating layer covering the first light-reflecting layer 17, where the active layer is not coupled to the second insulating layer. A gate dielectric layer is formed at a position near a center of the active layer.

At a step S43, the gate on the gate dielectric layer and the electrode layer 20 on the second insulating layer are formed simultaneity by a patterning process.

At a step S44, an interlayer dielectric layer 19 is formed on each of the exposed layer structures, where the interlayer dielectric layer 19 completely covers the formed structure. A first via hole is formed in the interlayer dielectric layer 19 based on a preset pattern, where the first via hole is only coupled to the active layer to expose only a portion of an upper surface of the active layer. A second via hole is formed in the interlayer dielectric layer 19 and the first insulating layer based on a preset pattern, where the second via hole is located at an edge of the active layer and exposes the edge of the active layer and a portion of the upper surface of the first insulating layer, as well as a portion of the upper surface of the first light-reflecting layer.

At the step S50, as shown in FIG. 3e, a source 21, a drain 22 and a metal layer 26 are formed.

Specifically, a metal material layer is formed on the interlayer dielectric layer 19, in the first via hole, and in the second via hole, and a part of the metal material layer other than those parts intended for the source 21, the drain 22, and the metal layer 26 is removed based on a preset pattern to form the source 21, the drain 22, and the metal layer 26. The source 21 is located at the first via hole, the drain 22 is located at the second via hole, and the metal layer 26 is disposed opposite to the electrode layer 20 and electrically coupled to the drain 22.

At the step S60, as shown in FIG. 3f, a third insulating layer 27 and a pixel defining layer 23 are formed.

Specifically, at a step S61, the third insulating layer 27 is formed on the interlayer dielectric layer 19, the source 21, the drain 22, and the metal layer 26 so that the third insulating layer 27 covers all the formed layer structures.

At a step S62, a pixel defining layer 23 is formed on the third insulating layer 27. Optionally, an upper surface of the pixel defining layer 23 is planar. The pixel defining layer 23 is used for separating light emitting regions in adjacent sub-pixels of the organic light emitting display substrate.

At the step S70, as shown in FIG. 3g, a third via hole is formed.

Specifically, a third via hole is formed in the pixel defining layer 23, the third insulating layer 27, the interlayer dielectric layer 19, and the first insulating layer corresponding to the first reflective electrode 13 based on a preset pattern, thereby exposing a portion of the transparent conductive layer 16 that corresponds to a portion of the first reflective electrode 13.

At the step S80, as shown in FIGS. 2a and 2b, an organic light emitting layer 24 and a second reflective electrode 25 are formed.

Specifically, at a step S81, the organic light emitting layer 24 is formed on the pixel defining layer 23 and in the third via hole so that the organic light emitting layer 24 covers all the formed structures.

At a step S82, a second reflective electrode 25 (such as a reflective cathode) is formed on the organic light emitting layer 24 to form an organic light emitting diode, where at least a part of the second reflective electrode 25 covers the drive transistor.

In addition, the gate, the source 21, the drain 22, and the electrode layer 20 in the present disclosure may be made of a commonly used metal material such as Ag, Cu. Al, Mo, etc., or may be multilayer metals such as MoNb/Cu/MoNb, or the like, or may be made of an alloy material of the above metals, such as AlNd, MoNb, etc., or may be a stacked structure made of a metal and a transparent conductive oxide (such as ITO, AZO, etc.), such as ITO/Ag/ITO, or the like. The material of the interlayer dielectric layer 19, the first insulating layer, the second insulating layer and the third insulating layer 27 in the present disclosure includes, but are not limited to, a conventional dielectric material such as SiOx, SiNx, SiON, or any new type of organic insulating material or a high dielectric constant (High k) material such as AlOx, HfOx, TaOx, etc.

The transparent conductive layer 16 in the present disclosure may be made of a transparent conductive oxide such as ITO, AZO, or the like.

The first light-reflecting layer 17, the second light-reflecting layer 18, the first reflective electrode 13, and the second reflective electrode 25 in the present disclosure are made of a material that is both electrically conductive and light-reflective, such as a metal material.

It should be understood that the above embodiments are merely exemplary embodiments for the purpose of illustrating the principle of the disclosure, and the disclosure is not limited thereto. Various modifications and improvements can be made by a person having ordinary skill in the art without departing from the spirit and essence of the disclosure. Accordingly, all of the modifications and improvements also fall into the protection scope of the disclosure.

What is claimed is:

1. An organic light emitting display substrate, comprising a substrate, and a drive transistor and an organic light emitting diode disposed on the substrate, wherein
in a direction away from the substrate, the organic light emitting diode successively comprises a first reflective electrode, an organic light emitting layer, and a second reflective electrode, the organic light emitting layer comprises a light outgoing surface through which light is emitted outside from the organic light emitting layer and a non-light outgoing surface through which no light is emitted outside from the organic light emitting layer, and a drain of the drive transistor is electrically coupled to the first reflective electrode;
the organic light emitting display substrate further comprises: a light guide layer comprising a light incident surface through which light is incident into the light guide layer, where the light incident surface is disposed opposite to the light outgoing surface of the organic light emitting diode so that the light emitted from the light outgoing surface enters the light guide layer which is configured to cause the light entering from the light incident surface to be emitted from a surface of the light guide layer proximal to the substrate; and
the drive transistor is disposed at a side of the light guide layer distal to the substrate.

2. The organic light emitting display substrate according to claim 1, wherein one side surface of the organic light emitting layer is the light outgoing surface, while the rest side surface is the non-light outgoing surface; and
one side surface of the light guide layer is the light incident surface.

3. The organic light emitting display substrate according to claim 2, further comprising a first insulating layer disposed between the light outgoing surface and the light incident surface,
wherein the light incident surface and the light outgoing surface are disposed opposite to each other by the first insulating layer.

4. The organic light emitting display substrate according to claim 3, wherein the first insulating layer is made of a transparent material.

5. The organic light emitting display substrate according to claim 4, wherein the transparent material comprises an inorganic insulating material selected from a group consisting of SiOx, SiNx, and AlOx.

6. The organic light emitting display substrate according to claim 1, further comprising:
a first light-reflecting layer disposed between the light guide layer and the drive transistor, and covering a surface of the light guide layer distal to the substrate.

7. The organic light emitting display substrate according to claim 6, further comprising a transparent conductive layer disposed between the first light-reflecting layer and the light guide layer, wherein
at least a part of the transparent conductive layer is superposed with the first light-reflecting layer, and the transparent conductive layer extends between the light outgoing surface and the light incident surface to be coupled to the first reflective electrode of the organic light emitting diode; and
a drain of the drive transistor is coupled to the first light-reflecting layer made of a conductive material.

8. The organic light emitting display substrate according to claim 7, wherein the transparent conductive layer extends between the organic light emitting layer and the first reflective electrode.

9. The organic light emitting display substrate according to claim 7, further comprising
an electrode layer disposed in a same layer as a gate of the drive transistor, and coupled to the gate;
wherein the electrode layer is disposed opposite to at least a part of the first light-reflecting layer to form a first capacitor.

10. The organic light emitting display substrate according to claim 9, further comprising
a metal layer disposed in a same layer as the drain of the drive transistor at a side of the electrode layer distal to the substrate, and coupled to the drain;
wherein at least a part of the metal layer is disposed opposite to the electrode layer to form a second capacitor.

11. The organic light emitting display substrate according to claim 1, further comprising:
a second light-reflecting layer disposed outside the non-light outgoing surface of the organic light emitting layer, and configured to reflect light emitted from the non-light outgoing surface back into the organic light emitting layer.

12. The organic light emitting display substrate according to claim 1, wherein the light guide layer comprises:
a reflective structure disposed on each surface of the light guide layer except the light incident surface and the surface proximal to the substrate, and configured to reflect light emitted from inside of the light guide layer toward the surface back into the light guide layer.

13. The organic light emitting display substrate according to claim 1, wherein at least a part of the second reflective electrode is disposed at a side of the drive transistor distal to the substrate and covers the drive transistor.

14. The organic light emitting display substrate according to claim 1, further comprising:
a planarization layer disposed at the side of the light guide layer distal to the substrate, and in contact with the light guide layer, the planarization layer having a refractive index smaller than that of the light guide layer.

15. The organic light emitting display substrate according to claim 1, further comprising:
a color filter layer disposed at a side of the light guide layer proximal to the substrate; and
a transparent insulating layer disposed between the color filter layer and the light guide layer, the transparent insulating layer having a refractive index greater than that of the light guide layer.

16. A method for manufacturing an organic light emitting display substrate, comprising:
disposing a drive transistor and an organic light emitting diode on a substrate so that in a direction away from the substrate, the organic light emitting diode successively comprises a first reflective electrode, an organic light emitting layer, and a second reflective electrode, the organic light emitting layer comprises a light outgoing surface through which light is emitted outside from the organic light emitting layer and a non-light outgoing surface through which no light is emitted outside from the organic light emitting layer, and a drain of the drive transistor is electrically coupled to the first reflective electrode;

wherein the disposing the drive transistor and the organic light emitting diode on the substrate further comprises disposing a light guide layer on the substrate so that the light guide layer comprises a light incident surface through which light is incident into the light guide layer, the light incident surface is disposed opposite to the light outgoing surface of the organic light emitting diode, the light emitted from the light outgoing surface enters the light guide layer which is configured to cause the light entering from the light incident surface to be emitted from a surface of the light guide layer proximal to the substrate, and the drive transistor is disposed at a side of the light guide layer distal to the substrate.

17. The method according to claim 16, wherein one side surface of the organic light emitting layer is the light outgoing surface, while the rest side surface is a non-light outgoing surface; and one side surface of the light guide layer is the light incident surface.

18. The method according to claim 17, wherein the disposing the drive transistor and the organic light emitting diode on the substrate comprises:

forming a color filter layer on a portion of the substrate and forming a transparent insulating layer on the color filter layer and a portion of the substrate so that the transparent insulating layer covers the color filter layer, and forming the first reflective electrode on the transparent insulating layer so that only a portion of the first reflective electrode overlaps an edge portion of the color filter layer;

forming the light guide layer on an upper surface of the transparent insulating layer at a position corresponding to the color filter layer so that a reflective structure is formed on a part of the light guide layer except a bottom surface and a side surface proximal to the first reflective electrode;

forming a planarization layer having an opening on an upper surface of the light guide layer, and an exposed upper surface of the transparent insulating layer so that a portion of the first reflective electrode and a portion of the upper surface and the side surface of the light guide layer proximal to the first reflective electrode are exposed, and so that an edge of the first reflective electrode distal to the light guide layer is spaced apart from the planarization layer to expose a portion of the upper surface of the transparent insulating layer proximal to the edge;

forming a transparent conductive layer on an upper surface of the planarization layer, the exposed portion of the upper surface and the exposed side surface of the light guide layer, and the exposed portion of the upper surface of the first reflective electrode;

forming a light-reflecting material layer having an opening on an upper surface of the transparent conductive layer, the remaining surface of the planarization layer, and the exposed portion of the upper surface of the transparent insulating layer, so as to expose a part of the transparent conductive layer corresponding to the light incident surface of the light guide layer and the upper surface of the transparent conductive layer superposed with the first reflective electrode, thereby forming a first light-reflecting layer on the transparent conductive layer covering the light guide layer and a second light-reflecting layer in contact with an edge of the transparent conductive layer distal to the light guide layer and the exposed portion of the upper surface of the first reflective electrode;

forming a first insulating layer covering a formed structure;

forming an active layer and a second insulating layer separated from each other on a portion of the upper surface of the first insulating layer covering the first light-reflecting layer, and forming a gate dielectric layer on the active layer;

forming a gate on the gate dielectric layer and forming an electrode layer on the second insulating layer;

forming an interlayer dielectric layer having a first via hole and a second via hole to cover a formed structure so that the first via hole exposes only a portion of the active layer, and the second via hole exposes an edge of the active layer and a portion of the first light-reflecting layer;

forming a source, a drain, and a metal layer in the first via hole, in the second via hole, and on the interlayer dielectric layer, respectively so that the metal layer is disposed opposite to the electrode layer and electrically coupled to the drain;

forming a third insulating layer and a pixel defining layer successively covering a formed structure;

forming a third via hole penetrating the first insulating layer, the interlayer dielectric layer, the third insulating layer and the pixel defining layer to expose a portion of the transparent conductive layer; and forming the organic light emitting layer and the second reflective electrode on the pixel defining layer and in the third via hole.

19. The organic light emitting display substrate according to claim 18, wherein the first insulating layer is made of a transparent material.

20. The organic light emitting display substrate according to claim 19, wherein the transparent material comprises an inorganic insulating material selected from a group consisting of SiOx, SiNx, and AlOx.

* * * * *